(12) United States Patent
Wang et al.

(10) Patent No.: US 11,791,155 B2
(45) Date of Patent: Oct. 17, 2023

(54) DIFFUSION BARRIERS FOR GERMANIUM

(71) Applicant: Applied Materials, Inc., Santa Clara, CA (US)

(72) Inventors: Huiyuan Wang, Santa Clara, CA (US); Susmit Singha Roy, Sunnyvale, CA (US); Takehito Koshizawa, San Jose, CA (US); Bo Qi, San Jose, CA (US); Abhijit Basu Mallick, Fremont, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 59 days.

(21) Appl. No.: 17/004,262

(22) Filed: Aug. 27, 2020

(65) Prior Publication Data
US 2022/0068640 A1    Mar. 3, 2022

(51) Int. Cl.
*H01L 21/02* (2006.01)
*H01L 29/16* (2006.01)

(52) U.S. Cl.
CPC .. *H01L 21/02304* (2013.01); *H01L 21/02236* (2013.01); *H01L 21/02362* (2013.01); *H01L 21/02532* (2013.01); *H01L 29/16* (2013.01)

(58) Field of Classification Search
CPC ........... H01L 29/78654; H01L 29/1079; H01L 29/66795; H01L 21/02192
See application file for complete search history.

(56) References Cited

U.S. PATENT DOCUMENTS

| 10,263,100 B1* | 4/2019 | Bi ..................... H01L 29/78654 |
| 2003/0228475 A1* | 12/2003 | Komada ................. B32B 27/08 |
| | | 428/447 |

(Continued)

FOREIGN PATENT DOCUMENTS

WO    2019-055415 A1    3/2019

OTHER PUBLICATIONS

International Search Report and Written Opinion dated Dec. 2, 2021 in International Patent Application No. PCT/US2021/045532, 8 pages.

(Continued)

*Primary Examiner* — Brian Turner
(74) *Attorney, Agent, or Firm* — Kilpatrick Townsend & Stockton LLP

(57) ABSTRACT

Examples of the present technology include semiconductor processing methods to form diffusion barriers for germanium in a semiconductor structure. The methods may include forming a semiconductor layer stack from pairs of Si-and-SiGe layers. The Si-and-SiGe layer pairs may be formed by forming a silicon layer, and then forming the germanium barrier layer of the silicon layer. In some embodiments, the germanium-barrier layer may be less than or about 20 Å. A silicon-germanium layer may be formed on the germanium-barrier layer to complete the formation of the Si-and-SiGe layer pair. In some embodiments, the silicon layer may be an amorphous silicon layer, and the SiGe layer may be characterized by greater than or about 5 atom % germanium. Examples of the present technology also include semiconductor structures that include a silicon-germanium layer, a germanium-barrier layer, and a silicon layer.

19 Claims, 6 Drawing Sheets

(56) References Cited

U.S. PATENT DOCUMENTS

| | | | |
|---|---|---|---|
| 2006/0170012 A1* | 8/2006 | Larmer | G01L 9/0042 |
| | | | 257/252 |
| 2007/0054505 A1* | 3/2007 | Antonelli | H01L 21/02274 |
| | | | 257/E21.279 |
| 2007/0148958 A1* | 6/2007 | Clevenger | H01L 23/5329 |
| | | | 438/789 |
| 2008/0311751 A1* | 12/2008 | Laermer | H01L 21/32137 |
| | | | 257/E21.299 |
| 2009/0026561 A1* | 1/2009 | Reichenbach | G01L 9/0073 |
| | | | 257/416 |
| 2009/0311877 A1 | 12/2009 | Olsen et al. | |
| 2010/0105216 A1 | 4/2010 | Kobayashi et al. | |
| 2010/0328639 A1* | 12/2010 | Jak | G02B 5/204 |
| | | | 355/71 |
| 2013/0028003 A1* | 1/2013 | Wang | H01L 45/1616 |
| | | | 257/4 |
| 2013/0252440 A1* | 9/2013 | Luo | H01L 21/76831 |
| | | | 438/787 |
| 2015/0228502 A1* | 8/2015 | Milenin | H01L 29/7842 |
| | | | 257/288 |
| 2016/0336405 A1 | 11/2016 | Sun et al. | |
| 2017/0170079 A1* | 6/2017 | Doris | H01L 21/0262 |
| 2019/0252396 A1 | 8/2019 | Mushiga et al. | |
| 2020/0035811 A1* | 1/2020 | Huang | H01L 21/02488 |
| 2020/0119015 A1* | 4/2020 | Bi | H01L 29/78684 |
| 2020/0286992 A1* | 9/2020 | Song | H01L 29/0673 |

OTHER PUBLICATIONS

Application No. PCT/US2021/045532 , International Preliminary Report on Patentability, dated Mar. 9, 2023, 7 pages.

* cited by examiner

DIFFUSION BARRIERS FOR GERMANIUM

TECHNICAL FIELD

The present technology relates to methods and systems for semiconductor processing. More specifically, the present technology relates to systems and methods for producing diffusion barriers for germanium in semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Embodiments of the present technology include semiconductor processing methods to form diffusion barriers for germanium on substrates. These diffusion barriers prevent germanium from migrating out of a germanium-containing layer (e.g., a silicon-germanium (SiGe) layer into an adjacent layer (e.g., a silicon (Si) layer) where the germanium can form undesirable crystals during an annealing operation. The present technology may be used to make semiconductor devices such as 3D NAND devices that include operations to form and anneal multiple pairs of Si-and-SiGe layers with fewer defects in the annealed layers from germanium crystallization. In some embodiments, the methods may include forming a semiconductor layer stack from pairs of Si-and-SiGe layers. The Si-and-SiGe layer pairs may be formed by forming a silicon layer, and then forming a germanium barrier layer of the silicon layer. In some embodiments, the germanium-barrier layer may be less than or about 20 Å. A silicon-germanium layer may be formed on the germanium-barrier layer to complete the formation of the Si-and-SiGe layer pair. In some embodiments, the silicon layer may be an amorphous silicon layer, and the SiGe layer may be characterized by greater than or about 5 atom % germanium.

In exemplary embodiments, the germanium-barrier layer may be made from one or more materials such as silicon oxide, silicon nitride, silicon oxynitride, germanium oxide, germanium nitride, or germanium oxynitride. In some embodiments, the germanium-barrier layer may be a silicon oxide layer that is formed by exposing the silicon layer to an oxidation plasma generated from an oxidation precursor comprising molecular oxygen ($O_2$). In additional embodiments, the oxidation precursor may include one or more of ozone ($O_3$), water ($H_2O$), and nitrous oxide ($N_2O$). The silicon layer may be exposed to the oxidation plasma for less than or about 5 seconds to form the silicon oxide layer that functions as a germanium-barrier layer. In some embodiments, a second germanium barrier layer may be formed on the SiGe layer before another Si-and-SiGe layer pair is formed. In these embodiments, a germanium barrier layer is formed between each Si layer and SiGe layer in the semiconductor layer stack. In some embodiments, the semiconductor layer stack may have greater than or about 50 Si-and-SiGe layer pairs.

In additional exemplary embodiments, the germanium-barrier layer may be a silicon nitride layer that is formed by exposing the silicon layer to a nitrogen-containing plasma generated from a nitrogen-containing precursor. In embodiments, the nitrogen-containing precursor may include one or more of molecular nitrogen ($N_2$), a combination of $N_2$ and $H_2$, and ammonium ($NH_3$), among other nitrogen-containing precursors. In additional embodiments, the nitrogen-containing precursor may be oxygen free.

The germanium diffusion barriers formed in the semiconductor layer stack slows the migration of germanium atoms from the SiGe layers into the Si layers during an annealing operation. In some embodiments, these annealing operations may include exposing the semiconductor layer stack to temperatures greater than or about 800° C. Exemplary embodiments of the annealing operation may include a rapid thermal anneal that rapidly heats the semiconductor layer stack to a temperature greater than or about 1000° C.

Embodiments of the present technology may also include semiconductor processing methods that form a silicon layer on substrate and expose the silicon layer to an oxidation plasma. The oxidation plasma may be generated from an $O_2$-containing oxygen precursor that treats the silicon layer for less than or about 5 seconds to form a silicon oxide layer on the exposed silicon layer. In some embodiments, the silicon oxide layer may be characterized by a thickness less than or about 20 Å. The methods may further include depositing a silicon-germanium layer on the silicon oxide layer. The substrate containing the silicon-germanium layer may be annealed at a temperature greater than or about 800° C.

In exemplary embodiments, the $O_2$-containing oxygen precursor may be delivered to a substrate processing chamber that holds the substrate, and the chamber may be characterized by a pressure of greater than or about 5 Torr during the generation of the oxidation plasma. In some embodiments, plasma power of less than or about 500 Watts may be delivered to the $O_2$-containing precursor to generate the oxidation plasma. In further embodiments, the $O_2$-containing precursor may include additional gases such as argon.

Embodiments of the present technology further include a semiconductor structure. In some embodiments, the semiconductor structure may include a silicon-germanium layer, a germanium-barrier layer, and a silicon layer. The germanium barrier layer may be in direct contact with the silicon layer and the silicon-germanium layer, and may be characterized by a thickness less than or about 20 Å. In some embodiments, the germanium barrier layer may be a silicon oxide layer. The silicon layer may be characterized by less than or about 0.01 wt. % germanium, and in some embodiments, the germanium present in the silicon layer may include crystalline germanium.

In exemplary embodiments of the semiconductor structure, the silicon-germanium layer may be characterized by greater than or about 5 atom % germanium, and the silicon layer may include crystallized silicon. In additional embodiments, at least one of the silicon-germanium layer and the silicon layer may be characterized by a thickness greater than or about 20 nm. In further exemplary embodiments, the semiconductor structure may include a semiconductor layer stack characterized by Si-and-SiGe layer pairs of a silicon layer and a silicon-germanium layer separated by germanium barrier layer. In some of these embodiments, a second germanium barrier layer may be in contact with the silicon-germanium layer. In exemplary embodiments, the semiconductor structure may include a semiconductor layer stack having greater than or about 50 Si-and-SiGe layer pairs.

Such technology may provide numerous benefits over semiconductor processing methods and structures that lack a germanium barrier layer between Si-and-SiGe layers. The germanium barrier layer may reduce or prevent the migration of germanium from the SiGe layer to the Si layer. The reduced amount of germanium migration into the Si layers maintains a high level of etch selectivity for the removal of the SiGe layers between the Si layers in fabrication processes like forming Si memory channels in 3D NAND devices. Reduced germanium migration in the Si layers also results in fewer germanium-containing crystals forming in the Si layers. These crystals create defects in the Si layers that can harm device performance, such as cause a reduced breakdown voltage for memory cells made from the Si layers. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
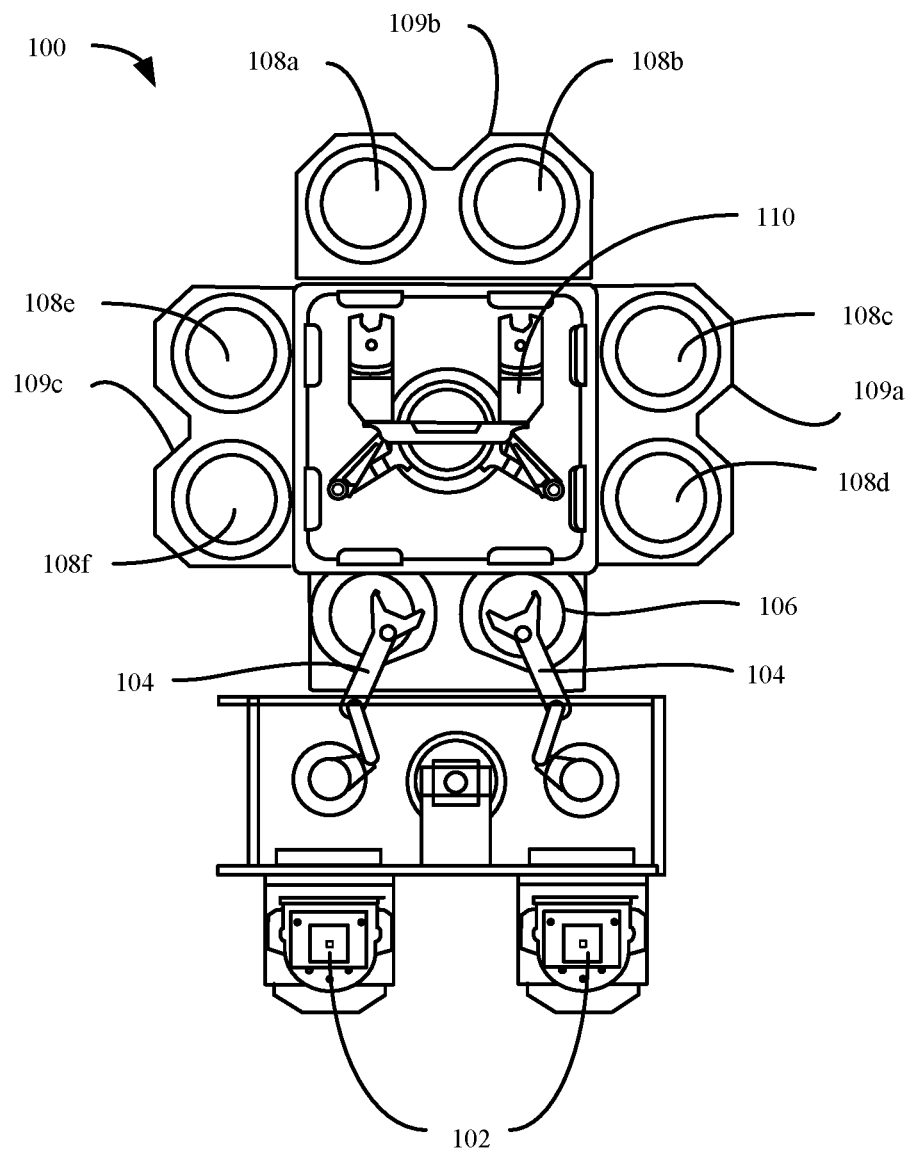
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems, methods, and structures, that form a barrier layer for germanium between two adjacent layers of semiconductor materials, one of which includes germanium. Embodiments of the present technology address the problem of germanium migrating from germanium-containing layers, such as silicon-germanium layers, to adjacent layers that are not formed with germanium, such as silicon layers. The germanium that infiltrates the adjacent layers often forms germanium crystals when the layers undergo heat treatments such as a rapid thermal anneal. The germanium crystals create defects in these previously germanium-free layers that can reduce the performance of a semiconductor device that includes the layers. For example, germanium crystals in an annealed silicon layer can increase the layer's electronic conductivity requiring semiconductor devices made with the layers to have higher operating voltages and more heat generation. Germanium crystal contamination can also lower a semiconductor device's breakdown voltage resulting in a higher rate of charge leakage and poorer performance for memory storage applications. Accordingly, in many conventional technologies, a layer intended to be germanium-free may actually include well over 1.0% germanium contamination.

One conventional approach to reducing germanium levels in adjacent layers is to reduce the amount of germanium in the germanium-containing layer. For example, when the germanium-containing layer is a SiGe layer, reducing the molar or weight ratio of germanium-to-silicon in the layer may result in less germanium migration to adjacent layers. However, reducing the molar or weight ratio of Ge-to-Si also reduces the etch selectivity of the SiGe layer relative to the adjacent layers (e.g., Si layers). In device structures like 3D NAND, the selective removal of the SiGe layers over the adjacent Si layers has been a major driver in pursuing these materials over ones made with conventional materials such as alternating layers of silicon oxide and silicon nitride. Thus, reducing the molar or weight ratio of Ge-to-Si in the SiGe layers makes these materials less compelling as an alternative to conventional SiO/SiN layers in 3D NAND fabrication.

Another conventional approach to reducing germanium levels in adjacent layers is to increase the thickness of the adjacent layers so the infiltrating germanium is less concentrated in the layers. For example, adjacent Si layers may be made thicker to reduce the concentration of germanium in the layer that migrates from a SiGe layer. However, increasing the thickness of the Si layers may also increase their deposition times as well as the time for etching semiconductor features such as contact holes through the layers. For device structures such as 3D NAND devices that may include hundreds of Si layers, even small increases in the thickness of the Si layers can result in larger increases in formation and etch times for the layer stack.

The present technology addresses these problems, among others, by providing semiconductor processing systems, methods, and structures that form a thin barrier layer for germanium to reduce or prevent the migration of germanium to adjacent layers that were initially formed germanium free. In some embodiments, the germanium barrier layer may be formed as a silicon or germanium-containing dielectric layer that is less than or about 20 Å thick. It has been discovered that barrier layers of this low thickness are effective to reduce or prevent germanium migration into the adjacent layers. Due to the thinness of the barrier layer, they may be deposited in short periods of time, such as less than or about 5 seconds. They also add relatively little thickness to a layer stack that can include greater than or about 50 pairs of a germanium-containing layer and an adjacent layer that was initially formed germanium free. The present technology permits, in some embodiments, the faster and thinner formation of Si-and-SiGe layer stacks with fewer post-anneal defects for applications such as 3D NAND device formation.

Although the remaining disclosure will routinely identify specific deposition processes utilizing the disclosed technology, it will be readily understood that the systems and methods are equally applicable to other deposition and treatment processes as may occur in the described chambers or any other chamber. Accordingly, the technology should not be considered to be so limited as for use with these specific deposition processes or chambers alone. The disclosure will discuss one possible system and chamber that may be used in performing process methods according to some embodiments of the present technology before additional variations and adjustments to this system according to embodiments of the present technology are described.

FIG. 1 shows a top plan view of one embodiment of a semiconductor processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, etc.

The substrate processing chambers 108a-f may include one or more system components for depositing, forming, annealing, and/or etching silicon-containing layers (e.g., Si layers) and germanium-containing layers (e.g., SiGe layers) on a substrate. In one configuration, two pairs of the processing chambers, e.g., 108c-d and 108e-f, may be used to deposit silicon-containing and silicon-germanium-containing materials on the substrate, as well as form a germanium barrier layer between each silicon-containing layer and germanium-containing layer. A third pair of processing chambers, e.g., 108a-b, may be used to anneal and etch the deposited/formed layers. In another configuration, all three pairs of chambers, e.g., 108a-f, may be configured for a substrate deposition of a semiconductor layer stack characterized by alternating Si layers and SiGe layers separated by a germanium barrier layer. Any one or more of the processes described may be carried out in chambers separated from the fabrication system shown in different embodiments. It will be appreciated that additional configurations of deposition, forming, annealing, and etching chambers for the layers are contemplated by system 100.

Figure 2A:
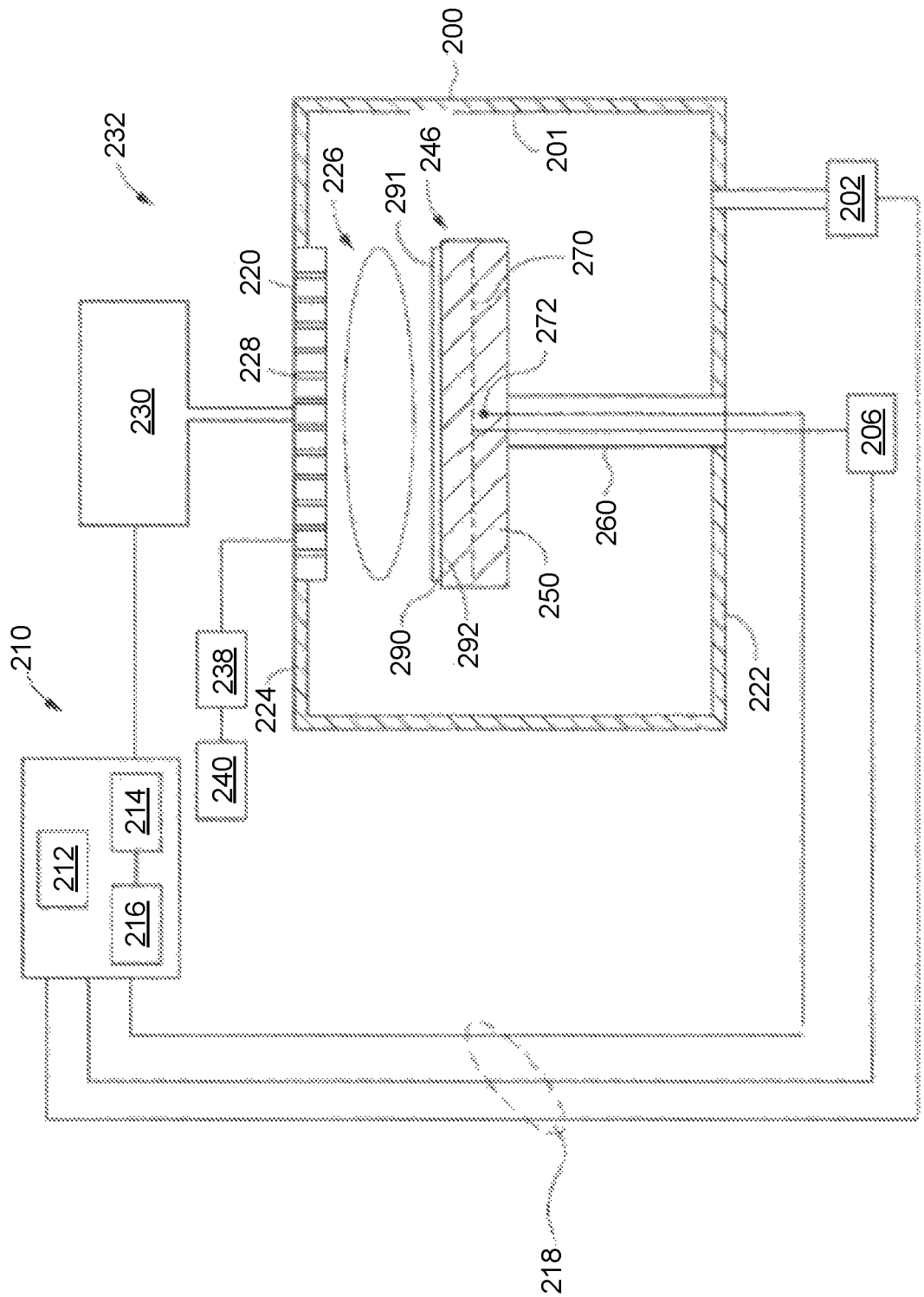
FIG. 2A shows a schematic cross-sectional view of an exemplary semiconductor processing chamber according to some embodiments of the present technology.
Figure 2B:
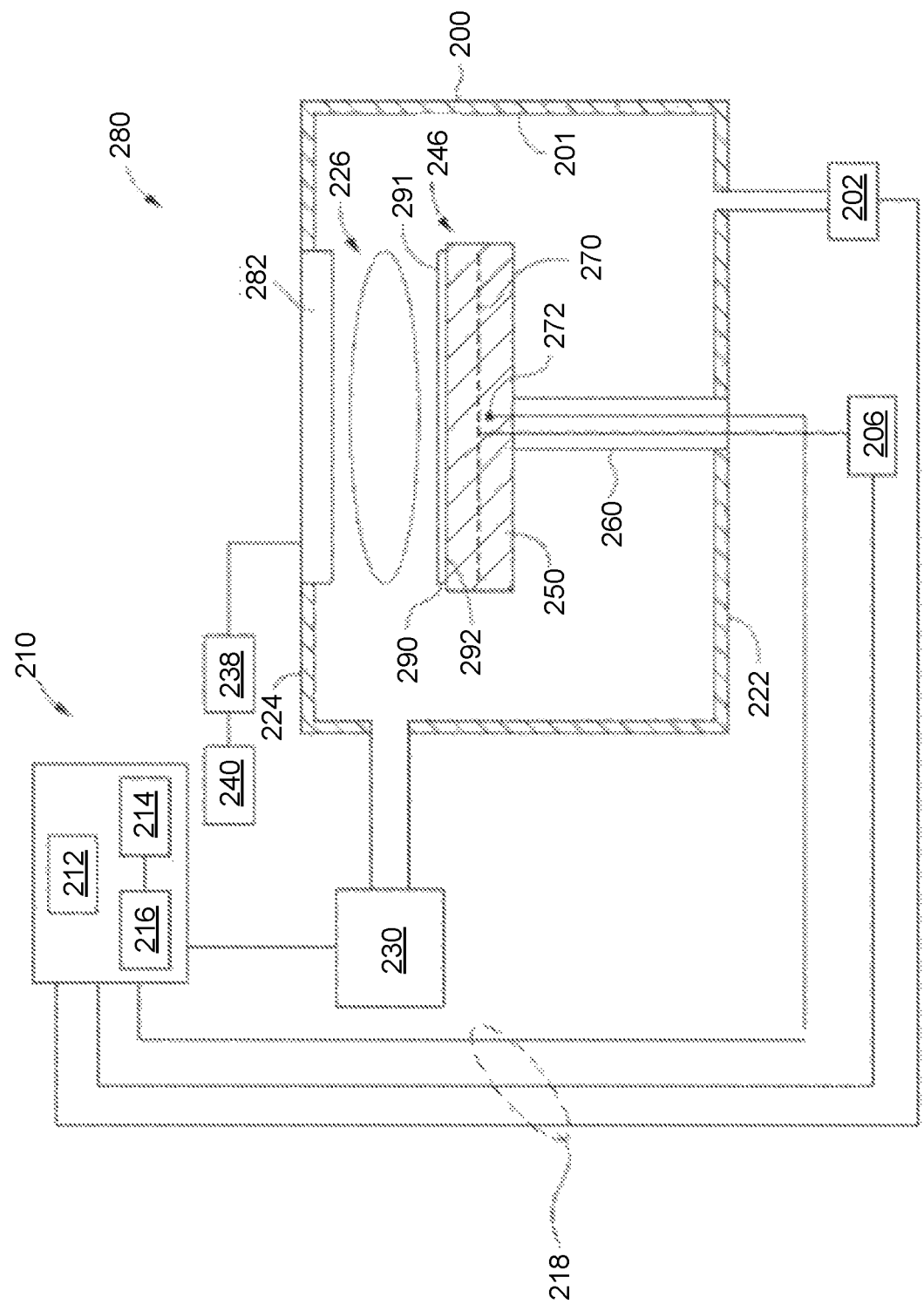
FIG. 2B shows a schematic cross-sectional view of an additional exemplary semiconductor processing chamber according to some embodiments of the present technology.

FIGS. 2A and 2B show a schematic cross-sectional views of an exemplary semiconductor processing systems 232 and 280 according to some embodiments of the present technology. The figures may illustrate an overview of systems incorporating one or more aspects of the present technology, and/or which may be specifically configured to perform one or more operations according to embodiments of the present technology. Additional details of the systems 232 and 280, and methods performed, may be described further below. Systems 232 and 280 may be utilized to form one or more pairs of a silicon-containing layer (e.g., an Si layer) and a germanium-containing layer (e.g., an SiGe layer), separated by a germanium barrier layer, according to some embodiments of the present technology, although it is to be understood that the methods may similarly be performed in any system within which layer formation may occur.

Referring now to FIG. 2A, the semiconductor processing system 232 includes semiconductor processing chamber 200, which may include a top wall 224, a sidewall 201 and a bottom wall 222 that define a substrate processing region 226. A gas panel 230 and a controller 210 may be coupled to the processing chamber 200. A substrate support assembly 246 may be provided in the substrate processing region 226 of the process chamber 200.

The substrate support assembly 246 may include an electrostatic chuck 250 supported by a stem 260. The electrostatic chuck 250 may be fabricated from aluminum, ceramic, and other suitable materials such as stainless steel. The electrostatic chuck 250 may be moved in a vertical direction inside the process chamber 200 using a displacement mechanism (not shown). A temperature sensor 272, such as a thermocouple, may be embedded in the electrostatic chuck 250 to monitor the temperature of the electrostatic chuck 250. The measured temperature may be used by the controller 210 to control the power supplied to the heater element 270 to maintain the substrate at a desired temperature.

A vacuum pump 202 may be coupled to a port formed in the bottom of the process chamber 200. The vacuum pump 202 may be used to maintain a desired gas pressure in the process chamber 200. The vacuum pump 202 also evacuates post-processing gases and by-products of the process from the process chamber 200.

A gas distribution assembly 220 having a plurality of apertures 228 may be disposed on the top of the process chamber 200 above the electrostatic chuck 250. The apertures 228 of the gas distribution assembly 220 are utilized to introduce process gases, such as deposition precursors or oxidation precursors, into the process chamber 200. The apertures 228 may have different sizes, number, distributions, shape, design, and diameters to facilitate the flow of the various process gases for different process requirements. The gas distribution assembly 220 is connected to the gas panel 230 that allows various gases to flow to the processing volume 226 during processing. A plasma is formed from the process gas mixture exiting the gas distribution assembly 220 to enhance the thermal decomposition and/or ionization of the process gases resulting in the deposition or formation of a material on a top surface 291 of a substrate 290 positioned on the electrostatic chuck 250.

The gas distribution assembly 220 and the electrostatic chuck 250 may form a pair of spaced apart electrodes in the processing volume 226. One or more RF power sources 240 provides a bias potential through a matching network 238, which is optional, to the gas distribution assembly 220 to facilitate generation of plasma between the gas distribution assembly 220 and the electrostatic chuck 250. Alternatively, the RF power source 240 and the matching network 238 may be coupled to the gas distribution assembly 220, the electrostatic chuck 250, or coupled to both the gas distribution assembly 220 and the electrostatic chuck 250, or coupled to an antenna (not shown) disposed exterior to the process chamber 200. In some embodiments, the RF power source 240 may produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power produced by RF power source 240 include 350 KHz, 2 MHz, 13.56 MHz, 27 MHz, 40 MHz, 60 MHz, 100 MHz, and 162 MHz, among other frequencies.

The controller 210 includes a central processing unit (CPU) 212, a memory 216. and a support circuit 214 utilized to control the process sequence and regulate the gas flows from the gas panel 230. The CPU 212 may be of any form of a general-purpose computer processor that may be used in an industrial setting. The software routines can be stored in the memory 216, such as random access memory, read only memory, floppy, or hard disk drive, or other form of digital storage. The support circuit 214 is coupled to the CPU 212 and may include cache, clock circuits, input/output systems, power supplies, and the like. Bi-directional communications between the controller 210 and the various components of the substrate processing system 232 are handled through numerous signal cables collectively referred to as signal buses 218, some of which are illustrated in FIG. 2A.

FIG. 2B depicts a schematic cross-sectional view of another substrate processing system 280 that can be used for the practice of embodiments described herein. The substrate processing system 280 is similar to the substrate processing system 232 of FIG. 2A, except that the substrate processing system 280 is configured to radially flow process gases from gas panel 230 across the top surface 291 of the substrate 290 via the sidewall 201. In addition, the gas distribution assembly 220 depicted in FIG. 2A is replaced with an electrode 282. The electrode 282 may be configured for secondary electron generation. In one embodiment, the electrode 282 is a silicon-containing electrode.

Figure 3:
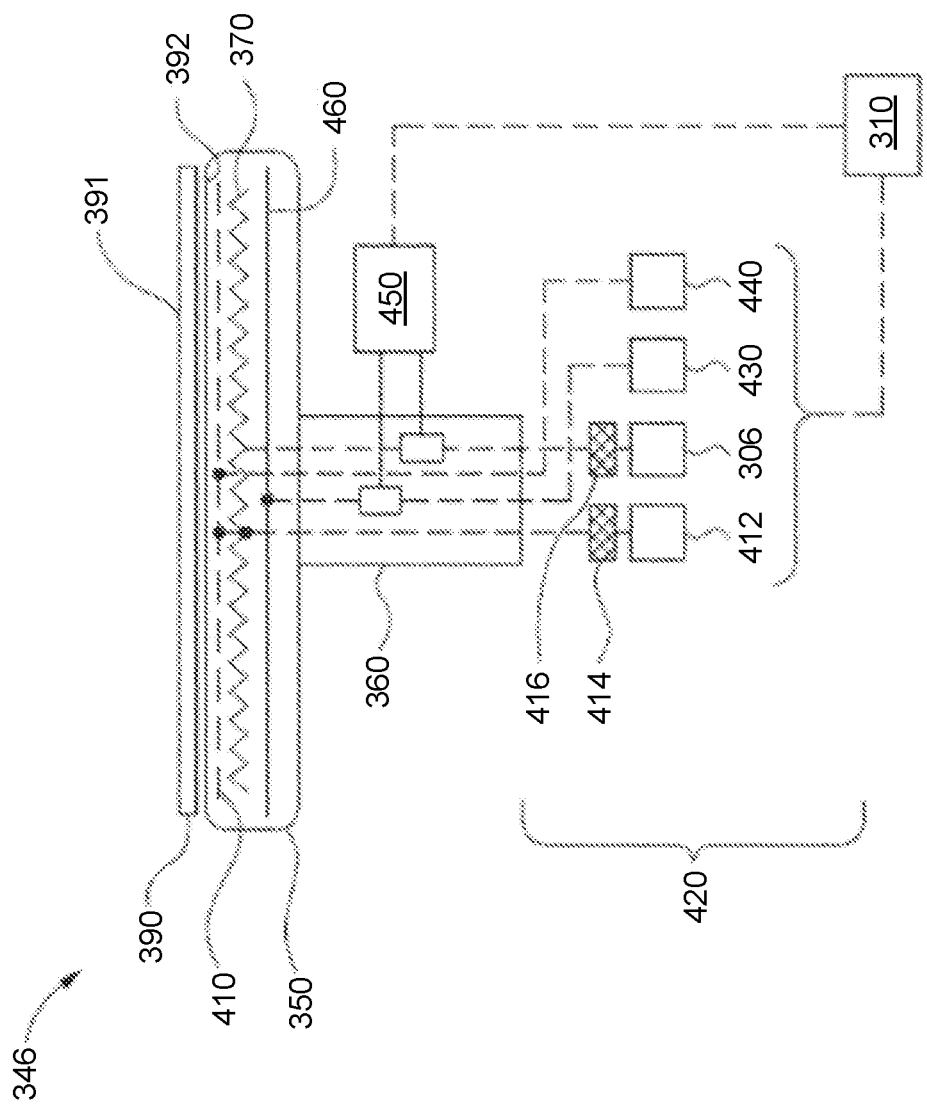
FIG. 3 shows a schematic cross-sectional view of an exemplary substrate support and electrostatic chuck according to some embodiments of the present technology.

FIG. 3 depicts a schematic cross-sectional view of the substrate support assembly 346 that may be used in embodiments of the systems. The substrate support assembly 346 may include an electrostatic chuck 350, which may include a heater element 370 suitable for controlling the temperature of the substrate 390 supported on an upper surface 392 of the electrostatic chuck 350. The heater element 370 may be embedded in the electrostatic chuck 350. The electrostatic chuck 350 may be resistively heated by applying an electric current from a heater power source 306 to the heater element 370. The heater power source 306 may be coupled through an RF filter 316 to protect the heater power source 306 from RF energy. The electric current supplied from the heater power source 306 is regulated by the controller 310 to control the heat generated by the heater element 370, thus maintaining the substrate 390 and the electrostatic chuck 350 at a substantially constant temperature during film deposition. The supplied electric current may be adjusted to selectively control the temperature of the electrostatic chuck 350 to be greater than or about 100° C. during a deposition, oxidation, and/or thermal anneal operation.

In some embodiments, the electrostatic chuck 350 includes a chucking electrode 410, which may he a mesh of a conductive material. The chucking electrode 410 may be embedded in the electrostatic chuck 350. The chucking electrode 410 is coupled to a chucking power source 412 that, when energized, electrostatically clamps the substrate 390 to the upper surface 392 of the electrostatic chuck 350.

The chucking electrode 310 may be configured as a monopolar or bipolar electrode, or have another suitable arrangement. The chucking electrode 410 may he coupled through an RF filter 414 to the chucking power source 412, which provides direct current (DC) power to electrostatically secure the substrate 390 to the upper surface 392 of the electrostatic chuck 350. The RF filter 414 prevents RF power utilized to form plasma within the process chamber from damaging electrical equipment. The electrostatic chuck 350 may be fabricated from a ceramic material, such as AlN or $Al_2O_3$.

A power application system 420 is coupled to the substrate support assembly 346. The power application system 420 may include the heater power source 306, the chucking power source 412, a first radio frequency (RF) power source 430, and a second RF power source 440. Embodiments of the power application system 420 may additionally include the controller 310, and a sensor device 450 that is in communication with the controller 310 and both of the first RF power source 430 and the second RF power source 440. The controller 310 may also be utilized to control the plasma from the processing gas by application of RF power from the first RF power source 430 and the second RF power source 440 in order to deposit a layer of material on the substrate 390.

As described above, the electrostatic chuck 350 includes the chucking electrode 410 that may function in one aspect to chuck the substrate 390 while also functioning as a first RF electrode. The electrostatic chuck 350 may also include a second RF electrode 460, and together with the chucking electrode 410, may apply RF power to tune the plasma. The first RF power source 430 may he coupled to the second RF electrode 460 while the second RF power source 440 may be coupled to the chucking electrode 410. A first matching network and a second matching network may be provided for the first RF power source 430 and the second RF power source 440, respectively. The second RF electrode 460 may be a solid metal plate of a conductive material or a mesh of conductive material.

The first RF power source 430 and the second RF power source 440 may produce power at the same frequency or a different frequency. In some embodiments, one or both of the first RF power source 430 and the second RF power source 440 may independently produce power at a frequency of greater than or about 100 KHz, greater than or about 500 KHz, greater than or about 1 MHz, greater than or about 10 MHz, greater than or about 20 MHz, greater than or about 50 MHz, greater than or about 100 MHz, among other frequency ranges. Specific examples of frequencies of the power independently produced by RF power sources 430, 440 include 350 KHz, 2 MHz, 13.56 MHz, 27 MHz, 40 MHz, 60 MHz, 100 MHz, and 162 MHz, among other frequencies. RF power from one or both of the first RF power source 430 and second RF power source 440 may be varied in order to tune the plasma.

Figure 4:
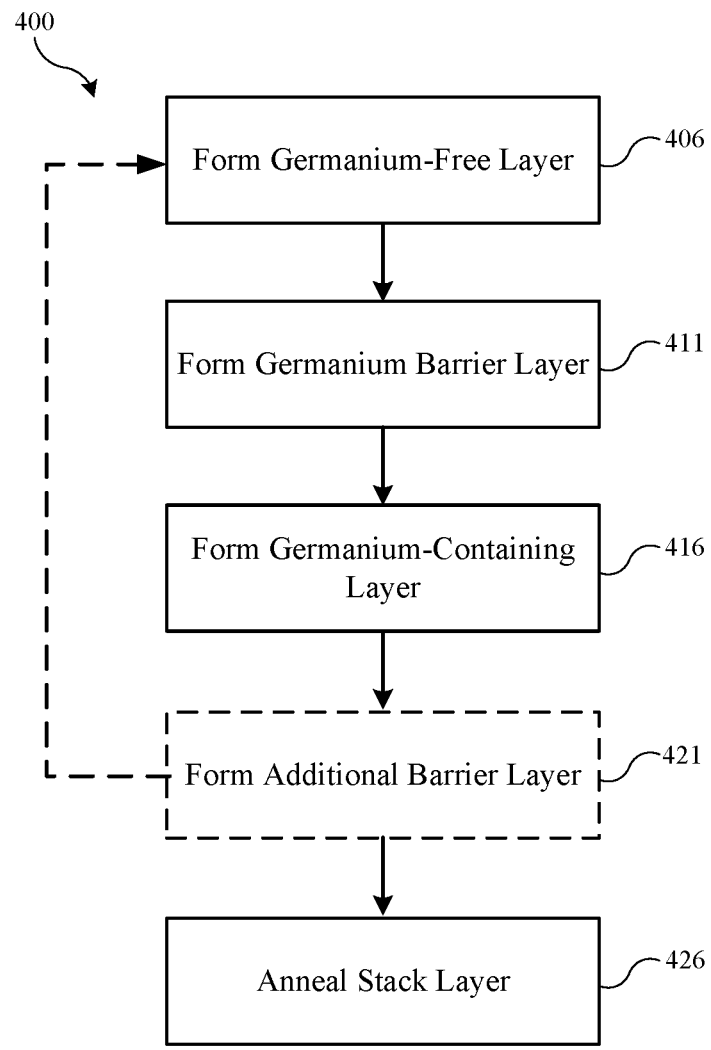
FIG. 4 shows operations in a semiconductor processing method according to some embodiments of the present technology.

FIG. 4 shows exemplary operations in a processing method 400 according to some embodiments of the present technology. In some embodiments, method 400 may include forming a layer stack on a substrate. The layer stack may include alternating pairs of a germanium-free layer and a germanium-containing layer that are separated by a germanium barrier layer. In some embodiments, the number of alternating pairs of layers may be greater than or about 50 pairs of layers. Embodiments of the layer stack formed on the substrate may be used to make a memory device such as a 3D NAND device. The germanium barrier layers between the alternating pairs of a germanium-free layer and a germanium-containing layer in the layer stack reduce or prevent germanium crystal growth in the germanium-free layer as a result of treatment operations such as an anneal of one or more alternating pairs, or an anneal of the fully formed layer stack. The reduction or elimination of germanium crystals in the germanium-free layers increases the electrical conductivity of the layers, among other improvements to device performance.

The processing method 400 may be performed in a variety of processing chambers, including processing systems 232, 280, and 118 described above. Method 400 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 400 may involve optional operations to develop the semiconductor structure to a particular fabrication operation. Although in some embodiments method 400 may be performed on a base structure, in some embodiments the method may be performed subsequent to other material formation or removal operations. For example, any number of deposition, forming, or removal operations may be performed to produce any number of structural features on the substrate. The operations to produce the underlying structures may be performed in the same chamber in which aspects of method 400 may be performed, and one or more operations may also be performed in one or more chambers on a similar platform as a chamber in which operations of method 400 may be performed, or on other platforms.

The method 400 may include an operation to form a germanium-free layer on a substrate 406. The substrate may be positioned in a substrate processing region of a substrate processing chamber. In embodiments, the substrate be a semiconductor wafer. In further embodiments, the substrate may be made from one or more of silicon, silicon oxide, silicon nitride, strained silicon, silicon-on-insulator, carbon-doped silicon oxides, amorphous silicon, doped silicon, germanium, gallium arsenide, glass, and sapphire. In still further embodiments, the substrate may be made from one or more electrically-conductive materials such as an elemental metal, a metal alloy, and metal nitrides, among other electrically-conductive materials. In some embodiments, the substrate may undergo a pretreatment operation before a first deposition of a germanium-free layer. Exemplary pretreatment operations may include one or more of polishing, etching, reducing, oxidizing, hydroxylating, nitridizing, annealing, and baking the substrate before the first deposition. In additional embodiments, substrate pretreatment operations may also include forming one or more layers of material on the substrate before the first deposition of the germanium-free layer.

In embodiments, the one or more layers of material may include a semiconductor layer (e.g., a poly-silicon layer) formed on the substrate. In further embodiments, the one or more layers may optionally include a sacrificial layer formed on the semiconductor layer. The sacrificial layer may be made from materials that can be selectively removed compared to adjacent layers (e.g., the semiconductor layer and the germanium-free layer). In still further embodiments, the one or more layers of material may include a wetting layer formed on either the semiconductor layer or on the sacrificial layer if present. The wetting layer may be formed from the same material as the germanium-free layer, but characterized by a deposition rate that may be less than the deposition rate to form the germanium-free layer. In embodiments, the wetting layer may act as a nucleation layer that aids in the deposition of the germanium-free layer. Exemplary substrates may take various shapes such as circular, rectangular, or square, and may have dimensions of, for example, 200 mm, 300 mm, or 450 mm, in diameter, side, or diagonal. In still more embodiments, substrate pretreatment operations may further include forming substrate features in the substrate. Examples of these substrate features may include one or more of a step, hole, doped region, or trench, that may be formed in the substrate, among other substrate features. In yet more embodiments, substrate pretreatment operations may further include forming substrate features in the one or more layers of material formed on the substrate.

In some embodiments, the formation of the germanium-free layer on the substrate may include delivering deposition precursors to the substrate processing region, where they may be activated to form an as-deposited germanium-free layer on the substrate. In additional embodiments, the deposition precursors may be activated by supplying plasma power to the precursors and generating a deposition plasma that deposits the germanium-free layer on the substrate. The as-deposited germanium-free layer may be characterized by a thickness greater than or about 20 nm, greater than or about 25 nm or more, greater than or about 30 nm or more, greater than or about 35 nm or more, greater than or about 40 nm or more, greater than or about 45 nm or more, greater than or about 50 nm or more, or more.

In some embodiments, the germanium-free layer may be a silicon-containing layer formed with a deposition plasma formed from silicon-containing deposition precursors. Embodiments of the silicon-containing deposition precursors may include silane ($SiH_4$), disilane ($Si_2H_6$), and tetrasilane ($Si_4H_{10}$), among other silicon-containing precursors. In some embodiments, the deposition precursors may also include one or more co-precursors such as hydrogen ($H_2$), helium (He), argon (Ar), and nitrogen ($N_2$), among other co-precursors. Embodiments of the silicon-containing layer deposited by the silicon-containing deposition precursors may include an amorphous silicon layer, a semi-crystalline silicon layer, or a polysilicon layer, among other types of silicon layers. Embodiments of the as-deposited, germanium-free silicon layer may be characterized by less than or about 2 at. % germanium, less than or about 1.5 at. % germanium, less than or about 1 at. % germanium, less than or about 0.5 at. % germanium, less than or about 0.25 at. % germanium, less than or about 0.1 at. % germanium, less than or about 0.05 at. % germanium, or less. Less germanium in the germanium-free layer increases the etch selectivity of the germanium-containing layer over the germanium-free layer. Less germanium in the germanium-free layer also reduces the number and size of germanium-containing crystals that form in the layer during a high-temperature anneal operation. Germanium-free layers with fewer and smaller germanium-containing crystals may be formed into semiconductor device components, for example memory cells, with lower electrical resistance and higher breakdown voltages, among other features.

In additional embodiments, the operation to form a germanium-free layer on a substrate 406 may be further characterized by maintaining a plasma deposition temperature in the substrate processing region. In some embodiments, during the formation of the germanium-free layer the plasma processing region may be characterized by a temperature less than or about 450° C., less than or about 425° C., less than or about 400° C., less than or about 375° C., less than or about 350° C., less than or about 325° C., less than or about 300° C., or less. In embodiments, higher temperatures in the plasma processing region may form germanium-free layers that are more dense and slower to etch than layers formed at lower temperatures. On the other hand, higher temperatures in the plasma processing region can increase the amount of germanium migrating from adjacent germanium-containing layers into the forming germanium-free layer. Embodiments of the present technology permits the formation of a germanium-free layer at higher temperatures in the plasma processing region without a proportional increase in the germanium level of the layer by placing a germanium barrier layer between the germanium-free layer and an adjacent germanium-containing layer.

In embodiments of the present technology, method 400 may further include forming a germanium barrier layer on the germanium-free layer 411. In some embodiments, the germanium barrier layer may be formed by exposing the germanium-free layer to a gas or plasma that reacts with the germanium-free layer to form the barrier layer. In additional embodiments, the barrier layer may be formed by exposing the germanium-free layer to a deposition gas or plasma that deposits the barrier layer on the germanium-free layer. Embodiments may include the formation of a germanium barrier layer made from one or more dielectric materials such as silicon oxide, silicon nitride, silicon oxynitride, germanium oxide, germanium nitride, or germanium oxynitride, among other dielectric materials. The barrier layer may have a thickness of less than or about 20 Å, less than or about 17.5 Å, less than or about 15 Å, less than or about 12.5 Å, less than or about 10 Å, or less. The germanium barrier layer may be formed in less than or about 5 seconds, less than or about 4 seconds, less than or about 3 seconds, less than or about 2 seconds, less than or about 1 second, or less. In embodiments, a thinner germanium barrier layer creates less material through which a hole, via, channel, etc. may etched in process methods of forming a semiconductor device such as a 3D NAND memory device. The thinner germanium barrier layer may also be formed in less time, which may increase process efficiency. The decrease in etched barrier layer material and formation time is multiplied by the number of barrier layers formed in a stack layer made of multiple sets of a germanium-free layer, a germanium barrier layer, a germanium-containing layer, and optionally an additional barrier layer. In some embodiments the stack layer may include greater than or about 50 sets of these layers.

In some embodiments, the germanium barrier layer may include silicon oxide that may be formed by the exposure of an underlying silicon layer to an oxidation plasma. In embodiments, the silicon layer may be exposed to the oxidation plasma for less than or about 5 seconds. In further embodiments, the oxidation plasma may be generated from an oxidation precursor that includes oxygen ($O_2$) gas. In still further embodiments, the oxidation precursor may include one or more of ozone ($O_3$), water ($H_2O$), and nitrous oxide ($N_2O$). In still further embodiments, the oxidation precursor may include one or more co-precursors such as helium or argon, among other co-precursors. The oxidation precursor may be delivered to a substrate processing region of a substrate processing chamber, where the chamber may be characterized by a pressure greater than or about 5 Torr during the formation of the barrier layer. The oxidation plasma may be generated by delivering plasma power to the oxidation precursors in a substrate processing region of a substrate processing chamber. In some embodiments, the plasma power delivered to the oxidation precursors may be less than or about 1000 Watts, less than or about 750 Watts, less than or about 500 Watts, less than or about 400 Watts, less than or about 300 Watts, or less. In additional embodiments, during the formation of the germanium barrier layer, the plasma processing region may be characterized by a temperature less than or about 500° C., less than or about 450° C., less than or about 425° C., less than or about 400° C., less than or about 375° C., less than or about 350° C., less than or about 325° C., less than or about 300° C., or less.

In additional embodiments, the germanium barrier layer may include silicon nitride that may be formed by the exposure of an underlying silicon layer to a nitrogen-containing plasma. In further embodiments, the nitrogen-containing plasma may be oxygen free. In embodiments, the silicon layer may be exposed to the nitrogen-containing plasma for less than or about 5 seconds. In still further embodiments, the nitrogen-containing plasma may be generated from a nitrogen-containing precursor that includes nitrogen ($N_2$) gas. In still further embodiments, the nitrogen-containing precursor may include one or more of a combination of nitrogen ($N_2$) and hydrogen ($H_2$), and ammonia ($NH_3$), among other nitrogen-containing precursors. In still further embodiments, the nitrogen-containing precursor may include one or more co-precursors such as helium or argon, among other co-precursors. The nitrogen-containing precursor may be delivered to a substrate processing region of a substrate processing chamber, where the chamber may be characterized by a pressure greater than or about 5 Torr during the formation of the silicon-nitride barrier layer. The nitrogen-containing plasma may be generated by delivering plasma power to the nitrogen-containing precursors in a substrate processing region of a substrate processing chamber. In some embodiments, the plasma power delivered to the nitrogen-containing precursors may be less than or about 1000 Watts, less than or about 750 Watts, less than or about 500 Watts, less than or about 400 Watts, less than or about 300 Watts, or less. In additional embodiments, during the formation of the germanium barrier layer, the plasma processing region may be characterized by a temperature less than or about 500° C., less than or about 450° C., less than or about 425° C., less than or about 400° C., less than or about 375° C., less than or about 350° C., less than or about 325° C., less than or about 300° C., or less.

In some embodiments, the as-deposited germanium barrier layer is germanium free and reduces or prevents the migration of germanium into the germanium-free layer during processing operations such as a furnace anneal or a rapid thermal anneal, among other operations that raise the temperature of the substrate to greater than or about 500° C. The reduced germanium migration maintains the etch selectivity between the germanium-free layer and the adjacent germanium-containing layer. A high etch selectivity between the layers permits a faster and more precise removal of the germanium-containing layers during the formation of spaced memory cells from the germanium-free layers in the fabrication memory devices such as 3D NAND devices. Reduced germanium migration in the germanium-free layers also results in fewer germanium-containing crystals forming in those layers. These crystals create defects in the germanium-free layers that can harm device performance, such as cause a reduced breakdown voltage for memory cells made from the germanium-free layers.

In embodiments of the present technology, method 400 may further include forming a germanium-containing layer on the germanium barrier layer 416. In some embodiments, the germanium-containing layer may be formed with a deposition plasma formed from germanium-containing deposition precursor such as germane ($GeH_4$). In additional embodiments, the germanium-containing deposition precursor may be combined with a silicon-containing deposition precursor, such as silane ($SiH_4$), disilane ($Si_2H_6$), and tetrasilane ($Si_4H_{10}$), among other silicon-containing precursors. In these embodiments, the deposited germanium-containing layer may be a silicon-germanium (SiGe) layer with an amount of germanium in the as-deposited SiGe layer which may be greater than or about 4 at. %, greater than or about 5 at. %, greater than or about 10 at. %, greater than or about 15 at. %, greater than or about 20 at. %, greater than or about 25 at. %, greater than or about 30 at. %, greater than or about 35 at. %, greater than or about 40 at. %, or more. In additional embodiments, the germanium-containing precursor may include one or more co-precursors such as hydrogen ($H_2$), helium (He), argon (Ar), and nitrogen ($N_2$), among other co-precursors.

In some embodiments of the present technology, method 400 may optionally include forming an additional barrier layer on the germanium-containing layer 421. The additional barrier layer may block the migration of germanium from the germanium-containing layer to an adjacent germanium-free layer. In some embodiments, the additional barrier layer may be formed by exposing the germanium-containing layer to a gas or plasma that reacts with the germanium-containing layer to form the barrier layer. In additional embodiments, the additional barrier layer may be formed by exposing the germanium-containing layer to a deposition gas or plasma that deposits the additional barrier layer on the germanium-containing layer. Embodiments may include the formation of the additional barrier layer made from one or more dielectric materials such as silicon oxide, silicon nitride, silicon oxynitride, germanium oxide, germanium nitride, or germanium oxynitride, among other dielectric materials. The additional barrier layer may have a thickness of less than or about 20 Å, less than or about 17.5 Å, less than or about 15 Å, less than or about 12.5 Å, less than or about 10 Å, or less. The additional barrier layer may be formed in less than or about 5 seconds less, than or about 4 seconds, less than or about 3 seconds, less than or about 2 seconds, less than or about 1 second, or less.

In some embodiments, method 400 may include two or more cycles of forming the germanium-free layer, germanium barrier layer, germanium-containing layer, and optionally the additional barrier layer, to make a layer stack on the substrate. In additional embodiments, the method 400 may include greater than or about 50 cycles, greater than or about 100 cycles, greater than or about 150 cycles, greater than or about 200 cycles, greater than or about 250 cycles, greater than or about 300 cycles, or more to make a layer stack on the substrate. In further embodiments, the germanium-free layers may be silicon layers, the germanium barrier layers and additional layers may be a silicon oxide layers, and the germanium-containing layers may be silicon-germanium layers. In these embodiments, the layer stack may be made from two or more pairs of the Si-and-SiGe layers. For example the layer stack may be made from greater than or about 50 pairs of the Si-and-SiGe layers.

In embodiments of the present technology, method 400 may also include annealing the substrate having at least one pair of a germanium-free layer and a germanium-containing layer with a germanium barrier layer positioned between the layers 426. In some embodiments, the anneal may be characterized as a rapid thermal anneal. In additional embodiments, the anneal may be characterized as a furnace anneal. In embodiments, the anneal temperature may be greater than or about 800° C., greater than or about 850° C., greater than or about 900° C., greater than or about 950° C., greater than or about 1000° C., greater than or about 1050° C., or more. In embodiments of furnace anneals, the anneal time may be greater than or about 30 minutes, greater than or about 1 hour, greater than or about 2 hours, or more. In embodiments of rapid thermal anneals, the anneal time may be less than or about 10 minutes, less than or about 5 minutes, less than or about 1 minute, less than or about 30 seconds, or less.

In some embodiments, the anneal operation may be performed on a substrate having a stack layer of two or more pairs of a germanium-free layer and a germanium-containing layer, a germanium barrier layer positioned between the layers, and optionally an additional barrier layer formed on the germanium-containing layer. In additional embodiments, the stack layer may include two or more pairs of an Si layer and an SiGe layer, where the Si layer may be the germanium-free layer, and the SiGe layer may be the germanium-containing layer. In these embodiments, a thin dielectric layer, such as a silicon oxide layer, may act as the germanium barrier layer between the Si layer and SiGe layer and the additional barrier layer formed on the germanium-containing layer.

In embodiments, the dielectric barrier layers in the stack layer may slow or prevent the migration of germanium from the SiGe layers to the Si layers. For example, after the anneal operation, at least one Si layer in the stack layer may be characterized by an amount of germanium that is less than or about 2 at. %, less than or about 1 at. %, less than or about 0.5 at. %, less than or about 0.1 at. %, or less. The low levels of germanium in the Si layers of the annealed stack layer reduce the amount of germanium crystallization in the Si layers. In some embodiments, the annealed Si layers in the stack layer may be characterized by a weight of germanium-containing crystals of less than or about 1 wt. %, less than or about 0.5 wt. %, less than or about 0.1 wt. %, less than or about 0.05 wt. %, or less. While the dielectric barrier layers may reduce or eliminate germanium-containing crystals in the annealed Si layers or the layer stack, they do not hinder the formation of silicon crystals in the Si layers. In some embodiments, the Si layers in the annealed stack layer may be characterized by an increased level of silicon crystallization compared to the as-deposited, amorphous Si layer. In embodiments, one or more of the annealed Si layers may be characterized as a polysilicon layer or a crystalline silicon layer.

It should also be appreciated that the dielectric barrier layers also do not prevent the formation of germanium-containing crystals in the annealed germanium-containing layers. In embodiments where a layered stack includes pairs of Si and SiGe layers, germanium crystals in the germanium-containing layer do not substantially lower its etch selectivity over the Si layer, and in some embodiments may increase the etch selectivity. In embodiments, an etch rate ratio for the SiGe layers over the Si layer may be greater than or about 10:1, greater than or about 20:1, greater than or about 30:1, greater than or about 40:1, greater than or about 50:1, or more. The dielectric barrier layers also maintain the high etch selectivity of SiGe layers over the Si layers by reducing the amount of post-anneal germanium in the Si layers. When the difference in germanium levels between the Si layers and the SiGe layers is increased, the etch rate ratio of the SiGe layers over the Si layers may also be increased.

In embodiments, a high etch selectivity for the germanium-containing layers over the germanium-free layers provides faster and more precise formation of spaced germanium-free layers following an etch operation. For example, in the fabrication of 3D NAND devices, the higher etch selectivity of the SiGe layers over the Si layers permits the SiGe layers to be removed in less time and with more precision to leave spaced Si layers for formation into memory cells. In some embodiments, the spaces left by the removed SiGe layers may be replaced with a conductive material such as tungsten to form word lines in a 3D NAND memory device.

Figure 5A:
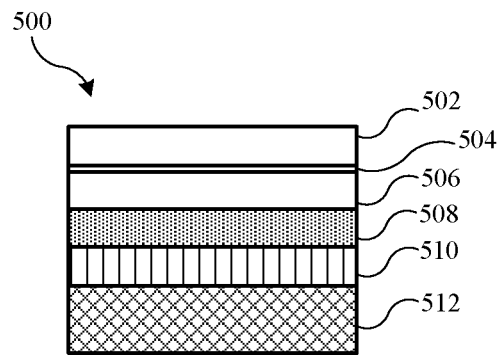
FIGS. 5A-C show cross-sectional views of exemplary semiconductor structures according to some embodiments of the present technology.
Figure 5B:
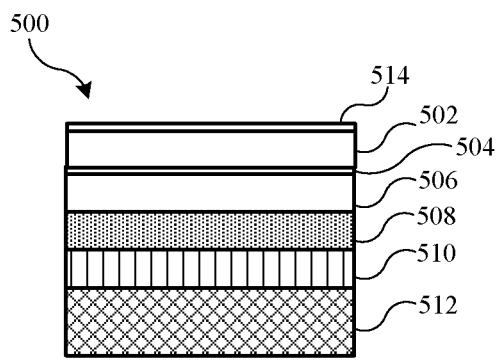
Figure 5C:
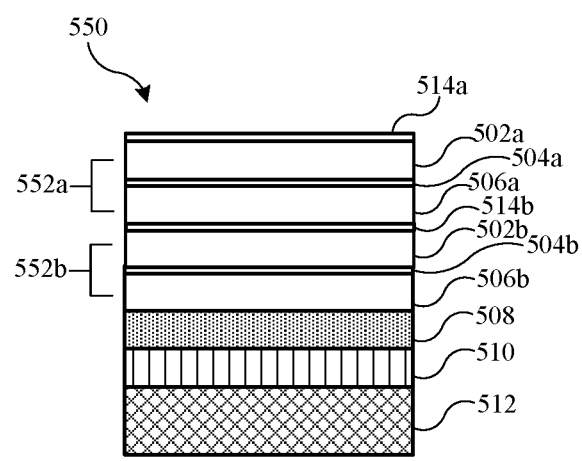

FIGS. 5A-C show cross-sectional views of exemplary semiconductor structures that may be made with processing methods according to some embodiments of the present technology. FIG. 5A shows an embodiment of a structure 500 that includes a germanium-containing layer 502 adjacent to a germanium barrier layer 504, which is adjacent to a germanium-free layer 506. In the embodiment shown, the germanium-free layer 506 is also adjacent to an optional sacrificial layer 508 and semiconductor layer 510 that are formed on a substrate layer 512. In some embodiments, the germanium barrier layer 604 may be characterized by a thickness less than or about 20 Å. In additional embodiments, the germanium-containing layer 502 may be characterized by a thickness greater than or about 20 nm, and the germanium-free layer 506 may be characterized by a thickness greater than or about 20 nm. In further embodiments, a thickness ratio of at least one of the germanium-containing layer 502 or the germanium-free layer 606 to the germanium barrier layer 504 may be greater than or about 10:1. The large difference in thickness between the germanium-containing/germanium-free layers 502, 506, and the germanium barrier layer 504 reflects the effectiveness of the barrier layer 504 at reducing or stopping germanium migration from the germanium-containing layer 502 to the germanium-free layer 506. In embodiments, an effective germanium barrier layer 504 may be characterized by a post-anneal reduction in the amount of germanium in the germanium-free layer 506 by greater than or about 50 at. %, greater than or about 75 at. %, greater than or about 90 at. %, or more compared to a germanium-containing/germanium-free layer pair that lacks a germanium barrier layer.

In some embodiments, the germanium-containing layer 502 may be a silicon-germanium layer (SiGe layer) and the germanium-free layer 506 may be a silicon layer (Si layer). In embodiments, the germanium-containing layer 502 may be characterized as having an amount of germanium that is greater than or about 5 wt. %, greater than or about 10 wt. %, greater than or about 15 wt. %, greater than or about 20 wt. %, greater than or about 25 wt. %, greater than or about 30 wt. %, greater than or about 35 wt. %, greater than or about 40 wt. %, or more. In some embodiments, subsequent an anneal operation, for example, the germanium-free layer 506 may be characterized as including less than or about 1.0 wt. % germanium, and may be characterized as including less than or about 0.5 wt. % germanium, less than or about 0.3 wt. % germanium, less than or about 0.1 wt. % germanium, less than or about 0.07 wt. % germanium, less than or about 0.05 wt. % germanium, less than or about 0.03 wt. % germanium, less than or about 0.01 wt. % germanium, or less, and the layer may be substantially or essentially free of germanium in some embodiments. In embodiments, the germanium-containing layer 502 may be an annealed layer that include germanium crystals. In further embodiments, the germanium-free, silicon layer 506 may include one or more of amorphous silicon, polysilicon, and crystalline silicon.

In additional embodiments the germanium barrier layer 504 may be a dielectric layer made from one or more of silicon oxide, silicon nitride, silicon oxynitride, germanium oxide, germanium nitride, and germanium oxynitride. In further embodiments, the optional sacrificial layer 508 may be made from a material that can be selectively removed more easily than adjacent layers (e.g., the germanium-free layer 506 and the semiconductor layer 510). In still further embodiments, the semiconductor layer 510 may be made of polysilicon, and the substrate layer 512 may be made of one or more of silicon, silicon oxide, silicon nitride, strained silicon, silicon-on-insulator, carbon-doped silicon oxides, amorphous silicon, doped silicon, germanium, gallium arsenide, glass, and sapphire.

FIG. 5B shows an embodiment of the structure 500 with an additional barrier layer 514 formed on the germanium-containing layer 502. In embodiments, the additional barrier layer 514 may function to reduce or prevent migration of germanium from the germanium-containing layer 502 to an additional germanium-free layer (not shown) formed on the germanium-containing layer 502. In embodiments, the additional barrier layer 514 may be formed or deposited on the germanium-containing layer, and may have a thickness of less than or about 20 Å. In further embodiments, the additional barrier layer may be made from one or more materials such as silicon oxide, silicon nitride, silicon oxynitride, germanium oxide, germanium nitride, and germanium oxynitride.

FIG. 5C shows an embodiment of a layer stack 550 that includes layer pairs 552a-b of germanium-containing layers 502a-b and germanium-free layers 506a-b separated by germanium barrier layers 504a-b. In the embodiment shown, the layer stack 550 also includes additional barrier layers 514a-b that separate germanium-containing layers 502a-b from a germanium-free layer 506a-b in adjacent layer pairs 552a-b. In embodiments of the present technology, additional layer pairs (not shown) may be formed on layer pairs 552a-b. In some embodiments, a layer stack may include greater than or about 50 layer pairs.

The embodiments of the present technology shown in the device structures of FIGS. 5A-C may be used to form a variety of semiconductor devices, such as 3D NAND memory devices. The germanium barrier layers between the germanium-free layers and germanium-containing layers permit the layers to be annealed without significant germanium migration into the germanium-free layers that can lower the etch selectivity for the removal of the germanium-containing layer during subsequent operations in the fabrication of the device. Low germanium migration also prevents significant formation of germanium-containing crystals in the germanium-free layer that can harm device performance. In addition, the thinness of the germanium barrier layers relative to the germanium-free layers and germanium-containing layers permit faster, more precise etching of vertical holes and channels through the layers because there is less material to etch. For layer stacks that include greater than or about 50 layer pairs, the cumulative reduction in material can make a vertical etch through the layer stack substantially faster and more precise.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a semiconductor layer stack from pairs of Si-and-SiGe layers, wherein the pairs of Si-and-SiGe layers are formed by:
   forming a silicon layer;
   forming a germanium barrier layer on the silicon layer, wherein the germanium barrier layer is less than or about 20 Å, and wherein the germanium barrier layer comprises a silicon oxide layer that is formed by exposing the silicon layer to an oxidation plasma generated from an oxidation precursor comprising $O_2$; and
   forming a silicon-germanium layer on the germanium barrier layer, wherein the silicon-germanium layer comprises greater than or about 30 at. % germanium.

2. The semiconductor processing method of claim 1, wherein the silicon layer is exposed to the oxidation plasma for less than or about 5 seconds.

3. The semiconductor processing method of claim 1, wherein the silicon-germanium layer comprises greater than or about 35 at. % germanium.

4. The semiconductor processing method of claim 1, wherein the method further comprises forming a second germanium barrier layer on the silicon-germanium layer, wherein the second germanium barrier layer is less than or about 20 Å.

5. The semiconductor processing method of claim 1, wherein the method further comprises annealing the semiconductor layer stack at a temperature greater than or about 800° C.

6. The semiconductor processing method of claim 1, wherein the method further comprises treating the semiconductor layer stack to a rapid thermal anneal at a temperature greater than or about 1000° C.

7. The semiconductor processing method of claim 1, wherein the semiconductor layer stack has greater than or about 50 pairs of the Si-and-SiGe layers.

8. A semiconductor processing method comprising:
   forming a silicon layer on a substrate;
   exposing the silicon layer to an oxidation plasma generated from an oxidation precursor comprising $O_2$, wherein the silicon layer is exposed to the oxidation plasma for less than or about 5 seconds, and wherein the exposure forms a silicon oxide layer on the silicon layer;
   depositing a silicon-germanium layer on the silicon oxide layer; and
   annealing the substrate containing the silicon-germanium layer at a temperature greater than 1000° C.

9. The semiconductor processing method of claim 8, wherein the oxidation precursor further comprises argon.

10. The semiconductor processing method of claim 8, wherein a plasma power is delivered to the oxidation precursor to generate the oxidation plasma, and wherein the plasma power delivered to the oxidation precursor is less than or about 500 Watts.

11. The semiconductor processing method of claim 8, wherein the oxidation plasma is generated in a substrate processing chamber that holds the substrate, and wherein the substrate processing chamber is characterized by a pressure greater than or about 5 Torr during the generation of the oxidation plasma.

12. The semiconductor processing method of claim 8, wherein the silicon oxide layer is characterized by a thickness less than 10 Å.

13. A semiconductor structure comprising:
    a silicon-germanium layer;
    a silicon layer, wherein the silicon layer is characterized by less than or about 0.1 wt. % germanium; and
    a germanium barrier layer in direct contact with the silicon layer and the silicon-germanium layer and positioned between the silicon layer and silicon-germanium layer, wherein the germanium barrier layer is characterized by a thickness less than 10 Å, and wherein the germanium barrier layer comprises a silicon oxide layer that is formed by exposing the silicon layer to an oxidation plasma generated from an oxidation precursor comprising $O_2$.

14. The semiconductor structure of claim 13, wherein the less than or about 0.1 wt. % germanium in the silicon layer comprises crystalline germanium.

15. The semiconductor structure of claim 13, wherein the structure further comprises a second germanium barrier layer in contact with the silicon-germanium layer, wherein the second germanium barrier layer is less than or about 20 Å.

16. The semiconductor structure of claim 13, wherein at least one of the silicon-germanium layer and the silicon layer is characterized by a thickness greater than or about 20 nm.

17. The semiconductor structure of claim 13, wherein the silicon-germanium layer is characterized by greater than or about 5 at. % germanium.

18. The semiconductor structure of claim 13, wherein the silicon layer comprises crystalized silicon.

19. The semiconductor processing method of claim 1, wherein the silicon layer is exposed to the oxidation plasma for less than or about 5 seconds.

* * * * *